(12) United States Patent
Omura

(10) Patent No.: US 9,887,093 B1
(45) Date of Patent: Feb. 6, 2018

(54) SEMICONDUCTOR DEVICE MANUFACTURING METHOD

(71) Applicant: Toshiba Memory Corporation, Tokyo (JP)

(72) Inventor: Mitsuhiro Omura, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/448,552

(22) Filed: Mar. 2, 2017

(30) Foreign Application Priority Data

Sep. 23, 2016 (JP) .................................. 2016-185879

(51) Int. Cl.
| | | |
|---|---|---|
| *H01L 21/308* | (2006.01) | |
| *H01L 21/027* | (2006.01) | |
| *H01L 21/02* | (2006.01) | |

(52) U.S. Cl.
CPC ...... *H01L 21/3085* (2013.01); *H01L 21/0217* (2013.01); *H01L 21/0273* (2013.01); *H01L 21/02164* (2013.01); *H01L 21/02282* (2013.01); *H01L 21/3081* (2013.01)

(58) Field of Classification Search
CPC ......... H01L 21/32139; H01L 21/31144; H01L 21/0217; H01L 21/02164; H01L 21/3081; H01L 21/3085
See application file for complete search history.

(56) References Cited

U.S. PATENT DOCUMENTS

| | | | |
|---|---|---|---|
| 8,581,323 B2 | 11/2013 | Uenaka et al. | |
| 8,912,593 B2 | 12/2014 | Matsuda | |
| 2009/0272982 A1* | 11/2009 | Nakamura | ........ H01L 29/66848 257/77 |
| 2017/0186760 A1* | 6/2017 | Hong | ................ H01L 27/11548 |

FOREIGN PATENT DOCUMENTS

| | | |
|---|---|---|
| JP | 2011-060958 | 3/2011 |
| JP | 2011-142276 | 7/2011 |
| JP | 2013-258360 | 12/2013 |

OTHER PUBLICATIONS

H. Tanaka, et al., "Bit Cost Scalable Technology with Punch and Plug Process for Ultra High Density Flash Memory," 2007 Symposium on VLSI Technology Digest of Technical Papers, 2007, pp. 14-15.

* cited by examiner

*Primary Examiner* — Dung Le
(74) *Attorney, Agent, or Firm* — Patterson & Sheridan, LLP

(57) ABSTRACT

A semiconductor device manufacturing method includes forming a first resist and a second resist on a stacked body that includes a plurality of first films and a plurality of second films, the second resist facing one or more side surfaces of the first resist; forming a third film in a slit between the first resist and the second resist, the third film covering the side surfaces of the first resist and defining exposed surfaces of the first resist not covered by the third film; performing a first etch of the stacked body from an upper surface using the first resist, the second resist, and the third film as a mask; selectively etching the one or more exposed surfaces of the first resist and the second resist; and performing a second etch of the stacked body from the upper surface using the first resist and the third film as a mask.

19 Claims, 9 Drawing Sheets

US 9,887,093 B1

SEMICONDUCTOR DEVICE MANUFACTURING METHOD

CROSS-REFERENCE TO RELATED APPLICATION

This application is based upon and claims the benefit of priority from Japanese Patent Application No. 2016-185879, filed Sep. 23, 2016, the entire contents of which are incorporated herein by reference.

FIELD

Embodiments described herein relate generally to a semiconductor device manufacturing method.

BACKGROUND

A stacked memory device is one example of a semiconductor device. In a stacked memory device, stacked electrode layers are formed in a stepped configuration for forming corresponding contact holes.

The stepped electrode layers can be formed, for example, by a combination of a resist slimming (trim) technique along with an etching technique. However, simply combining these techniques disadvantageously causes the formation of an unnecessary stepped region, and this unnecessary stepped region, in turn, disadvantageously increases a memory chip area.

DETAILED DESCRIPTION

An exemplary embodiment provides a semiconductor device manufacturing method capable of suppressing an increase in an area of a semiconductor chip.

In general, according to one embodiment, a semiconductor device manufacturing method includes forming a first resist and a second resist on a stacked body that includes a plurality of first films and a plurality of second films, the second resist facing one or more side surfaces of the first resist. The method further includes forming a third film in a slit between the first resist and the second resist, the third film covering the one or more side surfaces of the first resist and defining one or more exposed surfaces of the first resist not covered by the third film. The method further includes performing a first etch of the stacked body from an upper surface thereof using the first resist, the second resist, and the third film as a mask. The method further includes selectively etching the one or more exposed surfaces of the first resist except and the second resist. The method further includes performing a second etch of the stacked body from the upper surface using the first resist and the third film as a mask.

Embodiments of the present disclosure will be described hereinafter with reference to the drawings. In one embodiment of the present disclosure, a method of manufacturing a nonvolatile memory chip having a stacked structure will be described. However, this embodiment is not intended to limit the present disclosure.

Figure 1A:
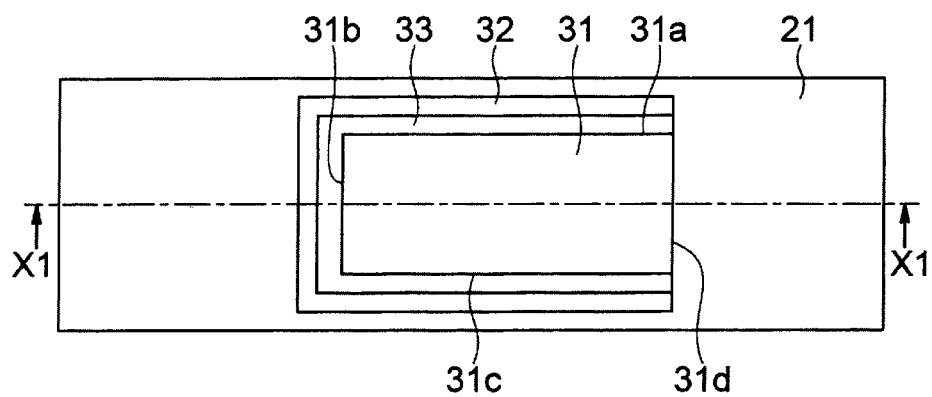
FIG. 1A is a plan view illustrating a resist formation step.
Figure 1B:
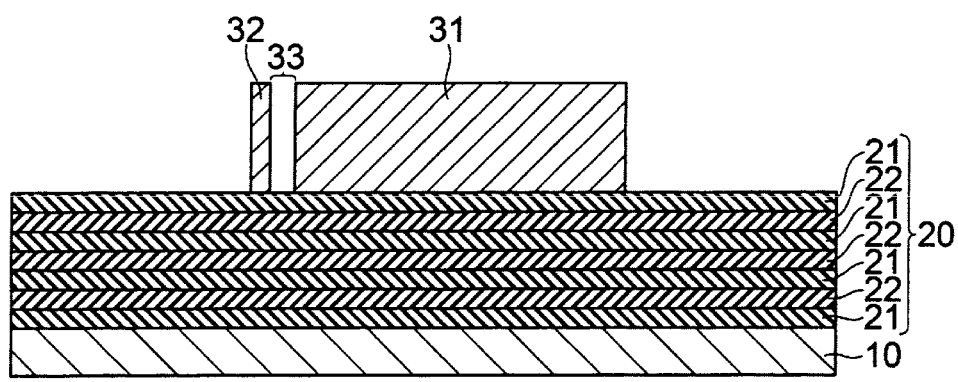
FIG. 1B is a cross-sectional view taken along a line X1-X1 shown in FIG. 1A.

FIG. 1A is a plan view illustrating a resist formation step, and FIG. 1B is a cross-sectional view taken along line X1-X1 shown in FIG. 1A. In this resist formation step, a first resist 31 and a second resist 32 are formed on an upper surface of a stacked body 20. The stacked body 20 will now be described.

The stacked body 20 is formed on a substrate 10 (FIG. 1B). On the substrate 10, various interconnects and elements (all of which are not shown) are formed. Furthermore, the stacked body 20 includes a plurality of first films 21 and a plurality of second films 22. The first films 21 are formed using, for example, a silicon oxide ($SiO_2$). The second films 22 are formed using, for example, a silicon nitride (SiN). The first films 21 and the second films 22 are alternately stacked using, for example, a CVD (Chemical Vapor Deposition) technique.

Subsequently to the stacked body 20 described above, the first resist 31 and the second resist 32 will be described. The first resist 31 and the second resist 32 are formed on the upper surface of the stacked body 20 using a lithography technique. The first resist 31 is formed into a rectangular shape to have four side surfaces 31a to 31d in a plan view. Furthermore, the second resist 32 is formed into a U-shape to face the three side surfaces 31a to 31c of the first resist 31.

The second resist 32 may face at least one side surface and at most three side surfaces out of the four side surfaces 31a to 31d of the first resist 31.

Following the resist formation step described above, a coating step is carried out to apply a third film. The step of coating a third film 40 will now be described with reference to FIGS. 2A and 2B.

Figure 2A:
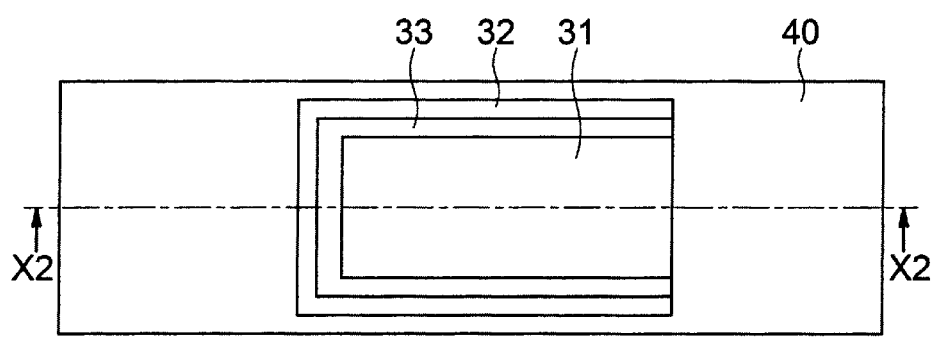
FIG. 2A is a plan view illustrating a film coating step.
Figure 2B:
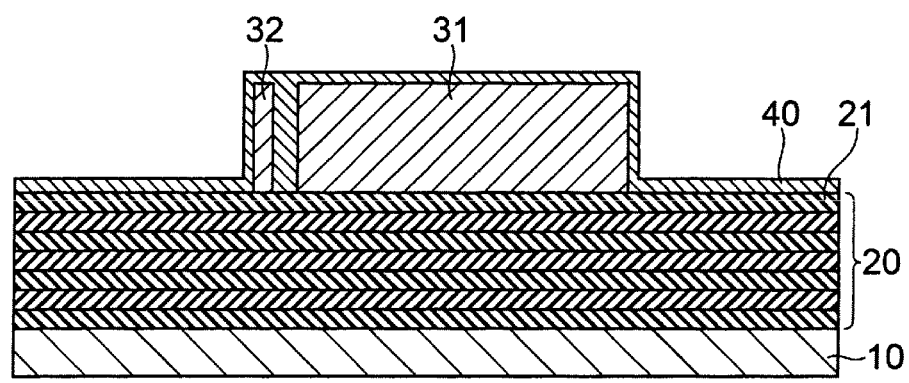
FIG. 2B is a cross-sectional view taken along line X2-X2 shown in FIG. 2A.

FIG. 2A is a plan view illustrating the step of coating the third film 40, and FIG. 2B is a cross-sectional view taken along line X2-X2 shown in FIG. 2A. In this coating step, a silicon oxide is formed using, for example, a spin coating technique.

Specifically, the silicon oxide is coated in such a manner as to cover entirely the first resist 31, the second resist 32, a slit 33 (FIG. 1B), and the upper surface of the stacked body 20. The slit 33 is a gap between the first resist 31 and the second resist 32.

Alternatively, the third film 40 can be formed using the CVD technique. In this alternative, it is preferable that a film formation temperature for the third film 40 is lower than a film formation temperature for the first films 21 to enable selective etching of the third film 40 relative to the first film 21 on an uppermost layer thereof.

Moreover, a metal oxide other than the silicon oxide, the metal oxide being removable by wet etching and exhibiting oxygen plasma resistance, may be used for the third film 40. For example, aluminum oxide ($Al_2O_3$), titanium oxide ($TiO_2$) or the like can be used for this third film 40.

Following the coating step described above, a step of etching the third film 40 is carried out. The step of etching the third film 40 will now be described with reference to FIGS. 3A and 3B.

Figure 3A:
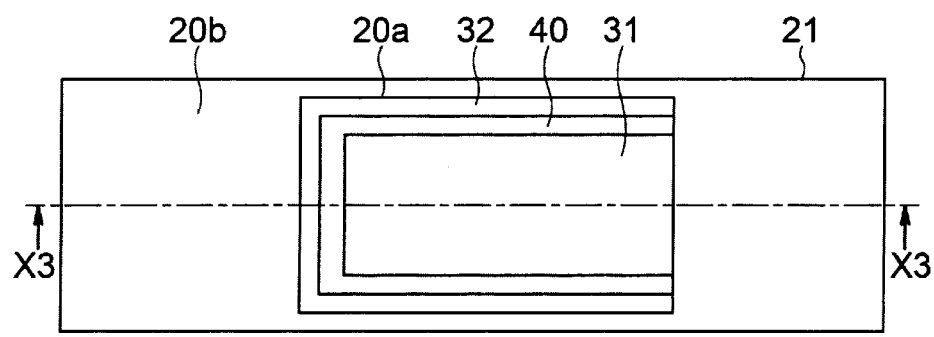
FIG. 3A is a plan view illustrating a film etching step.
Figure 3B:
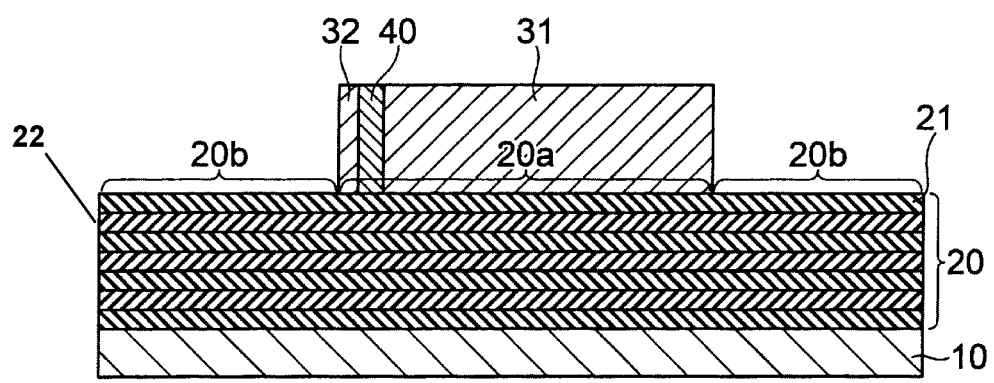
FIG. 3B is a cross-sectional view taken along line X3-X3 shown in FIG. 3A.

FIG. 3A is a plan view illustrating the step of etching the third film 40, and FIG. 3B is a cross-sectional view taken along line X3-X3 shown in FIG. 3A. In this etching step, the third film 40 that has been coated on portions other than the slit 33 is removed by wet etching.

In the present embodiment, the first films 21 are formed by the CVD technique and the third film 40 is formed by a coating method described above. That is, a film formation method for the first films 21 differs from a film formation method for the third film 40. The third film 40 can be, therefore, selectively etched relatively to the first films 21. Furthermore, if the first films 21 and the third film 40 are formed by the CVD technique, etch selectivity of the third film 40 relative to the first films 21 can be enhanced by changing the film formation temperatures.

A first region 20a and a second region 20b are formed on the stacked body 20 by the step of etching the third film 40 described above. The first region 20a is a region covered with the first resist 31, the second resist 32, and the third film 40. The second region 20b is an exposed region provided around the first region 20a.

Next, a step of etching the stacked body 20 is carried out. The step of etching the stacked body 20 will now be described with reference to FIGS. 4A and 4B.

Figure 4A:
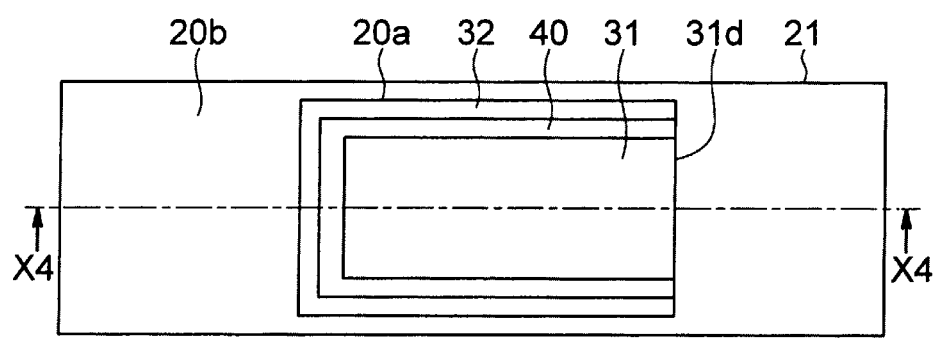
FIG. 4A is a plan view illustrating a stacked body etching step.
Figure 4B:
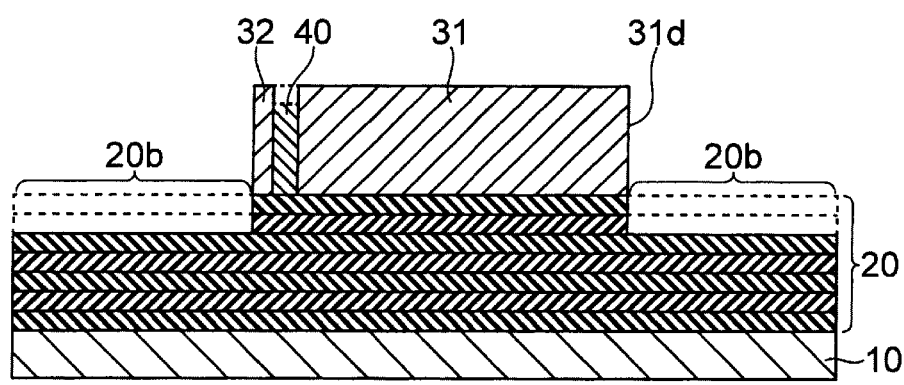
FIG. 4B is a cross-sectional view taken along line X4-X4 shown in FIG. 4A.

FIG. 4A is a plan view illustrating the step of etching the stacked body 20, and FIG. 4B is a cross-sectional view taken along line X4-X4 shown in FIG. 4A. In this etching step, the second region 20b on the stacked body 20 is etched from the upper surface of the stacked body 20 using the first resist 31, the second resist 32, and the third film 40 as a mask.

Specifically, a first film 21 located on the uppermost layer of the stacked body 20, and a second film 22 in contact with the first film 21, are etched in the second region 20b in a stacking direction by dry etching. At this time, a part of the third film 40, for example the silicon oxide film, is also etched in the stacking direction (thickness direction).

Following the step of etching the stacked body 20 described above, a resist slimming step is carried out. The resist slimming step will now be described with reference to FIGS. 5A and 5B.

Figure 5A:
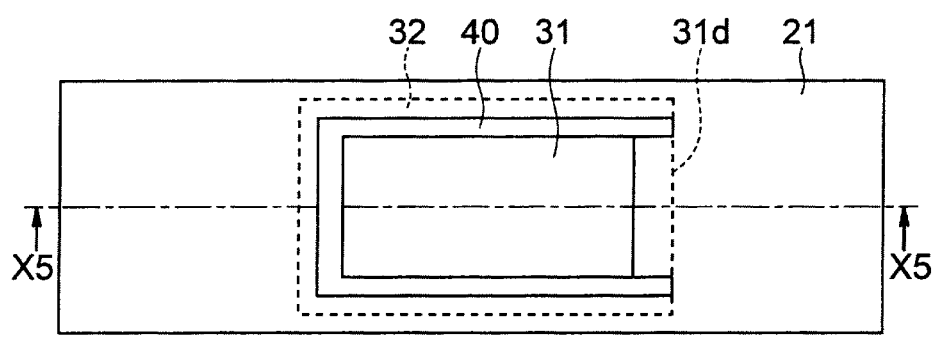
FIG. 5A is a plan view illustrating a resist slimming step.
Figure 5B:
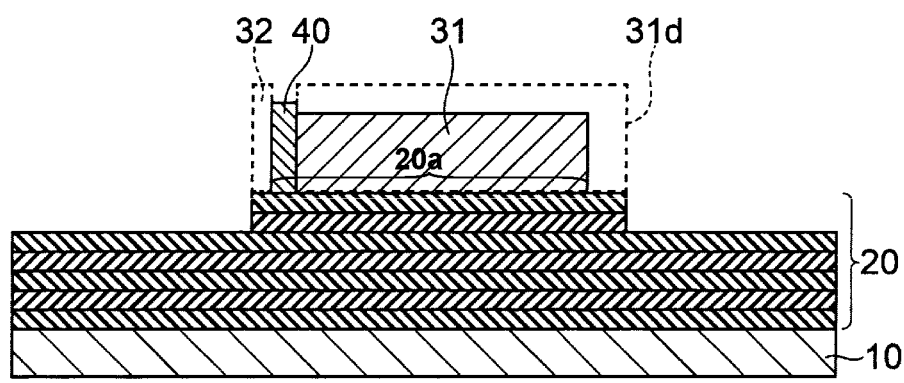
FIG. 5B is a cross-sectional view taken along line X5-X5 shown in FIG. 5A.

FIG. 5A is a plan view illustrating the resist slimming step, and FIG. 5B is a cross-sectional view taken along line X5-X5 shown in FIG. 5A. In this slimming step, the first resist 31 and the second resist 32 are etched.

Specifically, the second resist 32 is removed, and the first resist 31 is etched, including the side surface 31d which is not covered with the third film 40, by an oxygen plasma treatment. As a result, the third film 40 is exposed and a plane area of the first region 20a is reduced.

After the slimming step described above, the step of etching the stacked body 20 is carried out again. The step of etching the stacked body 20 a second time will now be described with reference to FIGS. 6A and 6B.

Figure 6A:
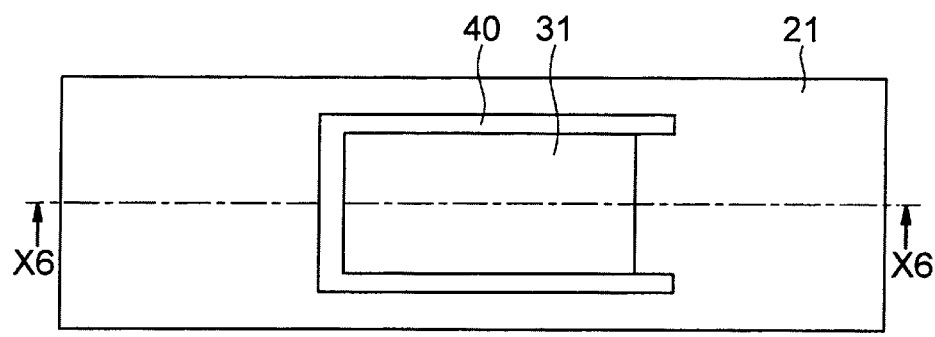
FIG. 6A is a plan view illustrating a second stacked body etching step.
Figure 6B:
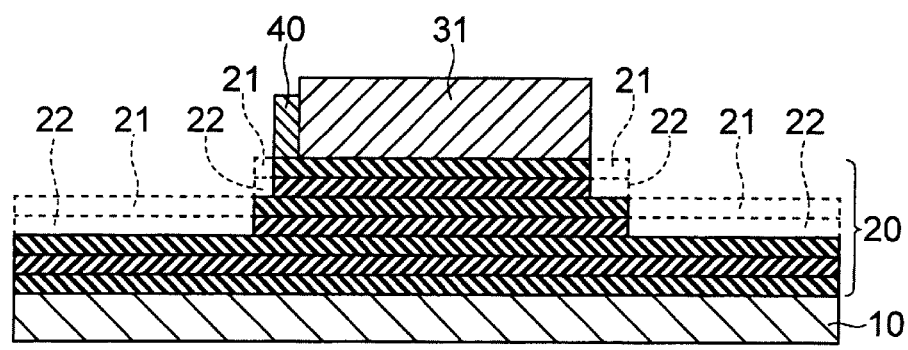
FIG. 6B is a cross-sectional view taken along line X6-X6 shown in FIG. 6A.

FIG. 6A is a plan view illustrating the step of etching the stacked body 20 the second time, and FIG. 6B is a cross-sectional view taken along line X6-X6 shown in FIG. 6A. In this second etching step, the stacked body 20 is etched again from the upper surface thereof using the first resist 31 and the third film 40 as a mask.

Specifically, the first film 21 which was exposed by the first etching step (see FIGS. 4A and 4B), that is the first film 21 at an upper surface of the stacked body 20 following the first etching step, and the second film 22 in contact with this first film 21, are etched in the stacking direction by dry etching in the second etching step. At this time, portions of the first film 21 and the second film 22 in contact with the first film 21, corresponding to portions of the first region 20a that were exposed in the first etching step when the plane area of the first region 20a was reduced, are etched in the stacking direction by the dry etching in the second etching step. Subsequently, a second resist slimming step is carried out.

Figure 7A:
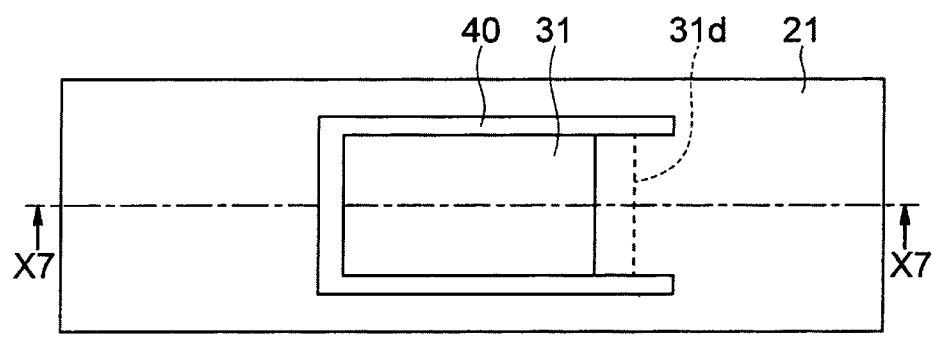
FIG. 7A is a plan view illustrating a second resist slimming step.
Figure 7B:
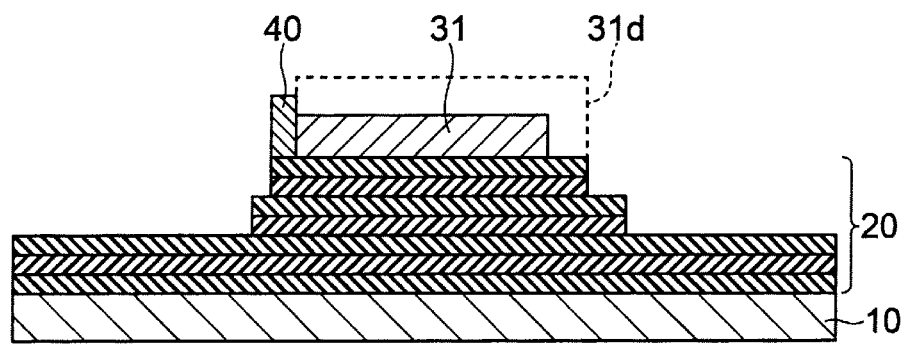
FIG. 7B is a cross-sectional view taken along line X7-X7 shown in FIG. 7A.

FIG. 7A is a plan view illustrating the second resist slimming step, and FIG. 7B is a cross-sectional view taken along line X7-X7 shown in FIG. 7A. In this second slimming step, the first resist 31 is slimmed down in order to further reduce the plane area of the first region 20a.

It is noted, however, that the third film 40 is not etched in the second and subsequent slimming steps (oxygen plasma treatment) since the third film 40 is formed from the silicon oxide film, or another film resistant to oxygen plasma treatment as described above. Thus, the first resist 31 is slimmed down from the side surface 31d that is not covered with the third film 40, along with the top surface thereof.

Figure 8A:
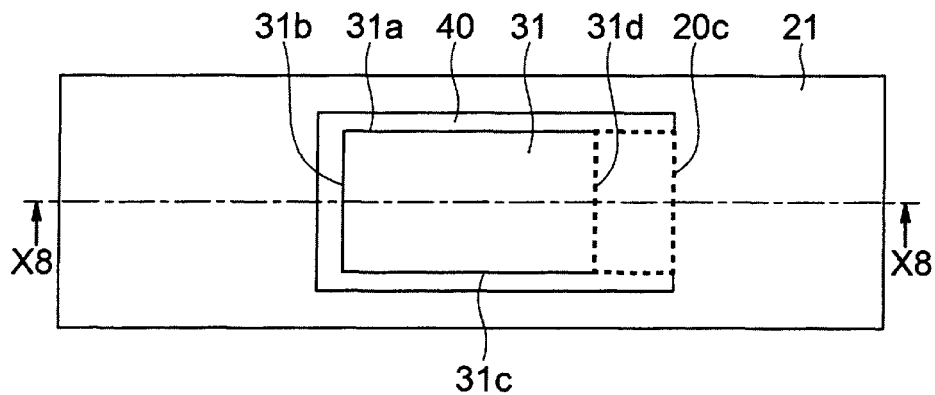
FIG. 8A is a plan view illustrating a third stacked body etching step.
Figure 8B:
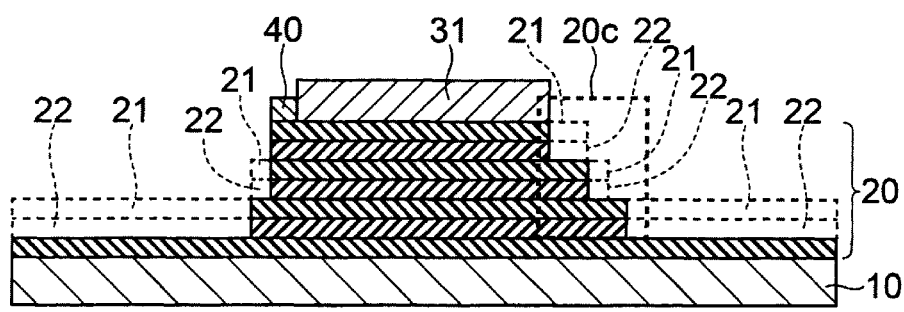
FIG. 8B is a cross-sectional view taken along line X8-X8 shown in FIG. 8A.

Subsequently, as shown in FIGS. 8A and 8B, a step of etching the stacked body 20 a third time is carried out. FIG. 8A is a plan view illustrating the step of etching the stacked body 20 the third time, and FIG. 8B is a cross-sectional view taken along line X8-X8 shown in FIG. 8A.

In the third etching step, a portion of the first film 21 and the second film 22 in contact with first film 21 which have been exposed by the second etching step (see FIGS. 6A and 6B) are selectively etched in the stacking direction by dry etching using the first resist 31 and the third film 40 as a mask. At this time, portions of the first film 21 and the second film 22 in contact with the first film 21 corresponding to portions of the first region 20a that were exposed in the second etching step when the plane area of the first region 20a was reduced, are etched in the stacking direction by the dry etching in the third etching step.

As described above, the steps of etching the stacked body 20 and the steps of slimming down the first resist 31 are repeatedly carried out, thereby forming a stepped region 20c in the stacked body 20 (see FIGS. 8A and 8B). This stepped region 20c does not extend to the side surfaces 31a to 31c of the first resist 31 which are covered with the third film 40, but is formed near the side surface 31d which is not covered with the third film 40. It is noted that the remaining first resist 31 and the remaining third film 40 are removed by an ashing treatment and a wet etching treatment.

The first resist 31 and the second resist 32 are formed from a material susceptible to etching by oxygen plasma, as noted above. Such materials include, for example, amorphous carbon. The first resist 31 and the second resist 32 may be formed by applying a precursor resist film to the stacked body 20 and patterning the precursor resist film by lithography, for example photolithography, to form the slit 33 separating the first resist 31 from the second resist 32. As shown in FIG. 5B, the slit 33 is positioned near an edge of the precursor resist so that the second resist 32 has a thickness similar to a thickness of the first resist 31 removed at the side 31d during a single resist slimming step such as the resist slimming process described herein with reference to FIGS. 5A and 5B. Thus, the second resist 32 can be removed in the resist slimming step.

Figure 9:
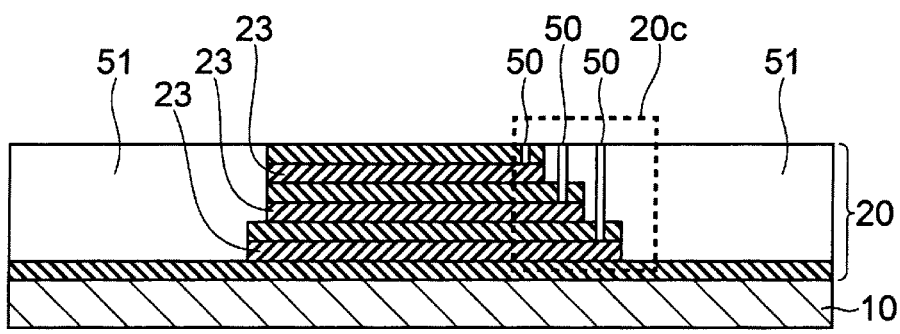
FIG. 9 is a cross-sectional view illustrating a contact hole formation step.

Moreover, following formation of the stepped region 20c, an exposed portion of the stacked body 20 including the stepped region 20c is covered with a silicon oxide film 51, as shown in FIG. 9. A memory hole penetrating the stacked body 20 is then formed. Furthermore, a slit penetrating the stacked body 20 separately from the memory hole is formed and the second films 22 are replaced by electrode layers 23 using this slit. Subsequently, as shown in FIG. 9, contact holes 50 are formed to correspond to the stacked electrode layers 23, respectively.

FIG. 9 is a cross-sectional view illustrating a step of forming the contact holes 50. As shown in FIG. 9, each contact hole 50 is formed in the stepped region 20c of the stacked body 20. Furthermore, each contact hole 50 penetrates the first film 21 at a respective step of the stepped region 20c from a front surface of the silicon oxide film 51 covering the stacked body 20, and extends to the corresponding electrode layer 23.

Assuming that the steps of etching the stacked body 20 and the steps of slimming down the first resist 31 are repeated in a state where the second resist 32 and the third film 40 described above are not provided, the stepped region 20c is formed in four directions of the first resist 31.

However, it suffices to form the contact holes 40 in the stepped region 20c in one direction, so that the stepped region 20c in the three remaining directions becomes unnecessary. This unnecessary stepped region possibly causes an increase in chip area.

To address the problem, according to the present embodiment, the side surfaces of the first resist 31 that do not need to be stepped are surrounded with the second resist 32 and the side surfaces are covered with the third film 40. This third film 40 functions as an etching stopper film during etching of the stacked body 20, thereby restricting a location where the stepped region 20c is formed. It is thereby possible to suppress an increase in chip area.

Figure 10A:
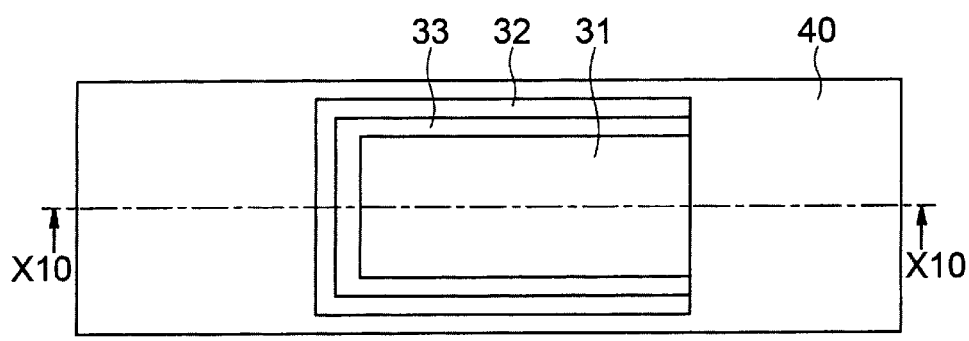
FIG. 10A is a plan view illustrating manufacturing steps according to a modification.
Figure 10B:
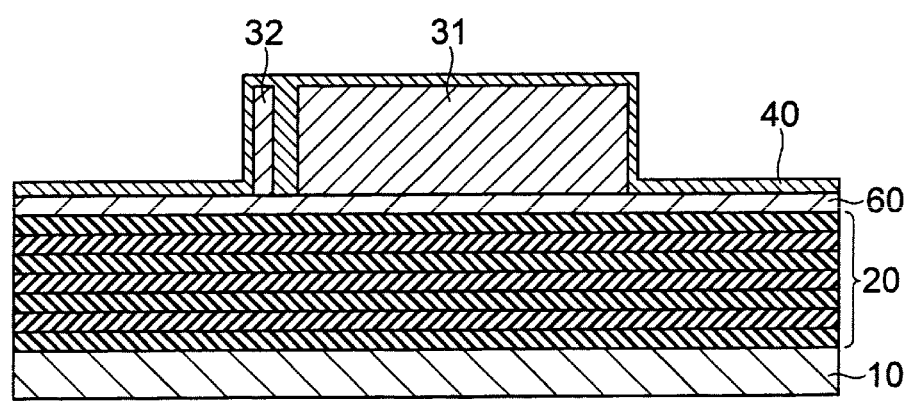
FIG. 10B is a cross-sectional view taken along line X10-X10 shown in FIG. 10A.

(Modification) FIG. 10A is a plan view illustrating manufacturing steps according to a modification, and FIG. 10B is a cross-sectional view taken along line X10-X10 shown in FIG. 10A.

In the present modification, a fourth film 60 is formed on the upper surface of the stacked body 20, and the first resist 31, the second resist 32, and the third film 40 are formed on this fourth film 60. The fourth film 60 is formed using, for example, a silicon nitride or polysilicon.

According to the present modification, the fourth film 60 functions as an etching stopper film during etching of the third film 40. Owing to this, even if the first film 21 formed on the uppermost layer of the stacked body 20 and the third film 40 are formed from silicon oxide films produced by the same process (at the same etching rate), the fourth film 60 can protect this first film 21 during etching of the third film 40. Therefore, it is possible to easily, selectively etch the third film 40 relatively to the first film 21 without requiring time and labor for the adjustment of etching time and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

What is claimed is:

1. A semiconductor device manufacturing method, comprising:
    forming a first resist and a second resist on a stacked body that comprises a plurality of first films and a plurality of second films, the first resist comprising at least four side surfaces, the second resist facing one or more of the side surfaces of the first resist;
    forming a third film in a slit between the first resist and the second resist, the third film covering the one or more side surfaces of the first resist and defining one or more exposed surfaces of the first resist not covered by the third film;
    performing a first etch of the stacked body from an upper surface thereof using the first resist, the second resist, and the third film as a mask;
    selectively etching the one or more exposed surfaces of the first resist and the second resist; and
    performing a second etch of the stacked body from the upper surface using the first resist and the third film as a mask.

2. The semiconductor device manufacturing method according to claim 1, wherein selectively etching the one or more exposed surfaces of the first resist and etching of the stacked body are alternately repeated.

3. The semiconductor device manufacturing method according to claim 1, wherein the third film is formed using a silicon oxide or a metal oxide.

4. The semiconductor device manufacturing method according to claim 3, wherein the third film is formed by applying the silicon oxide or the metal oxide into the slit using a spin coating technique.

5. The semiconductor device manufacturing method according to claim 1, further comprising:
    forming a fourth film on the upper surface of the stacked body using a silicon nitride or polysilicon; and
    forming the first resist, the second resist, and the third film on the fourth film.

6. The semiconductor device manufacturing method according to claim 1, wherein:
    the first resist is formed into a rectangular shape to have four side surfaces, and
    the second resist is formed into a U-shape to face three side surfaces out of the four side surfaces.

7. The semiconductor device manufacturing method according to claim 1, wherein the first films are formed using a silicon oxide, and the second films are formed using a silicon nitride.

8. The semiconductor device manufacturing method according to claim 1, wherein selectively etching the one or more exposed surfaces of the first resist comprises reducing a coverage area of the first resist.

9. The semiconductor device manufacturing method according to claim 1, wherein the third film is formed at a film formation temperature different from that of the first films and the second films.

10. A semiconductor device manufacturing method, comprising:
    forming a first resist and a second resist on a stacked body that comprises a plurality of first films and a plurality of second films, the second resist facing a plurality of side surfaces of the first resist;

forming a third film in a slit between the first resist and the second resist, the third film covering the plurality of side surfaces of the first resist and defining an exposed surface of the first resist not covered by the third film;

performing a first etch of the stacked body from an upper surface thereof using the first resist, the second resist, and the third film as a mask;

selectively etching the exposed surface of the first resist and the second resist to reduce a coverage area of the first resist; and performing a second etch of the stacked body from the upper surface using the first resist and the third film as a mask.

11. The semiconductor device manufacturing method according to claim 10, wherein selectively etching the exposed surface of the first resist and etching of the stacked body are alternately repeated.

12. The semiconductor device manufacturing method according to claim 10, wherein the third film is formed using a silicon oxide or a metal oxide.

13. The semiconductor device manufacturing method according to claim 12, wherein the third film is formed by coating the silicon oxide or the metal oxide into the slit.

14. The semiconductor device manufacturing method according to claim 10, further comprising:

forming a fourth film on the upper surface of the stacked body using a silicon nitride or polysilicon; and forming the first resist, the second resist, and the third film on the fourth film.

15. The semiconductor device manufacturing method according to claim 10, wherein:

the first resist is formed into a rectangular shape to have four side surfaces, and the second resist is formed into a U-shape to face three side surfaces out of the four side surfaces.

16. The semiconductor device manufacturing method according to claim 10, wherein the first films are formed using a silicon oxide, and the second films are formed using a silicon nitride.

17. The semiconductor device manufacturing method according to claim 10, wherein selectively etching the exposed surface of the first resist comprises reducing a coverage area of the first resist.

18. The semiconductor device manufacturing method according to claim 10, wherein the third film is formed at a film formation temperature different from that of the first films and the second films.

19. A semiconductor device manufacturing method comprising:

forming a first resist and a second resist on a stacked body that comprises a plurality of first films and a plurality of second films, the second resist facing a plurality of side surfaces of the first resist;

forming a third film in a slit between the first resist and the second resist, the third film covering the plurality of side surfaces of the first resist and defining an exposed surface of the first resist not covered by the third film;

performing a first etch of the stacked body from an upper surface thereof using the first resist, the second resist, and the third film as a mask;

performing a first selective etch of the exposed surface of the first resist and the second resist to reduce a coverage area of the first resist and remove the second resist;

performing a second etch of the stacked body from the upper surface using the first resist and the third film as a mask;

performing a third etch of the exposed surface of the first resist to further reduce the coverage area of the first resist; and performing a fourth etch of the stacked body from the upper surface using the first resist and the third film as a mask to form a stepped region of the stacked body.

* * * * *